Figure 1:
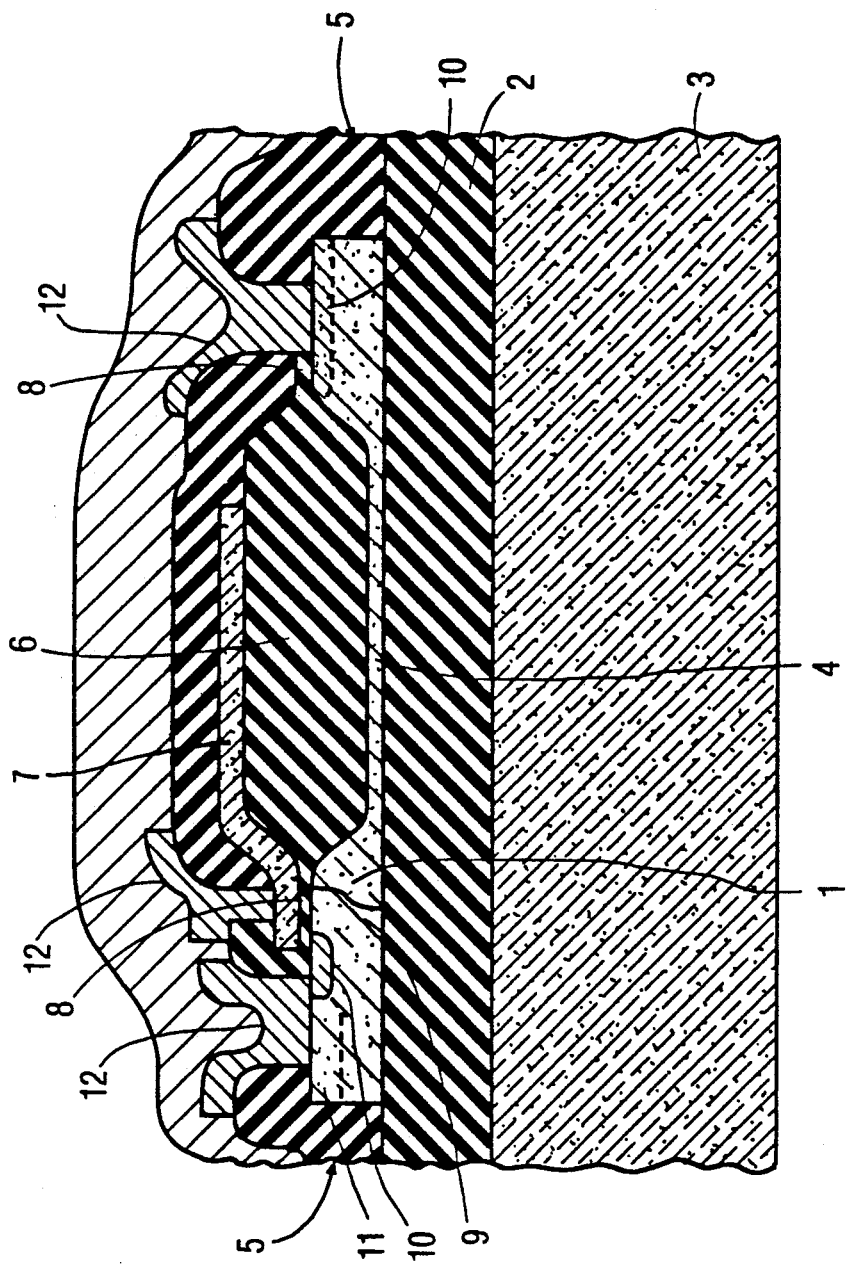

United States Patent [19]

Merchant

[11] Patent Number: 5,246,870
[45] Date of Patent: Sep. 21, 1993

[54] METHOD FOR MAKING AN IMPROVED HIGH VOLTAGE THIN FILM TRANSISTOR HAVING A LINEAR DOPING PROFILE

[75] Inventor: Steven L. Merchant, Yorktown Heights, N.Y.

[73] Assignee: North American Philips Corporation, New York, N.Y.

[21] Appl. No.: 811,554

[22] Filed: Dec. 20, 1991

Related U.S. Application Data

[63] Continuation-in-part of Ser. No. 650,391, Feb. 1, 1991.

[51] Int. Cl.$^5$ .................. H01L 21/283; H01L 21/336; H01L 21/84
[52] U.S. Cl. ......................... 437/21; 437/41; 257/347
[58] Field of Search ............ 437/21, 40, 41; 357/23.7; 257/347

[56] References Cited

U.S. PATENT DOCUMENTS

| | | | |
|---|---|---|---|
| 4,373,254 | 2/1983 | Blumenfeld | 437/21 |
| 4,437,225 | 3/1984 | Mizutani | 437/41 |
| 4,861,731 | 8/1989 | Bhagat | 437/51 |

FOREIGN PATENT DOCUMENTS

| | | | |
|---|---|---|---|
| 1-158775 | 6/1989 | Japan | 357/23.7 |
| 2-84718 | 3/1990 | Japan | 437/21 |

OTHER PUBLICATIONS

Ratnam, "Novel Silicon-on-Insulator MOSFET for High Voltage Integrated Circuits", Electronics Letters, 13th Apr. 1989, vol. 25, No. 8, pp. 536-537.

Primary Examiner—Mary Wilczewski
Attorney, Agent, or Firm—Paul R. Miller

[57] ABSTRACT

An improvement in a self-passivated high voltage semiconductor device is set forth with a thinned SOI layer having a linear lateral doping region coated with an oxide layer and a field plate being a part of the gate electrode layer. A high voltage SOI semiconductor device is formed having freedom from external electric fields.

5 Claims, 2 Drawing Sheets

METHOD FOR MAKING AN IMPROVED HIGH VOLTAGE THIN FILM TRANSISTOR HAVING A LINEAR DOPING PROFILE

The present invention is a continuation-in-part of previous U.S. patent application Ser. No. 07/650,391, filed Feb. 1, 1991. The present inventor is a co-inventor of the previous application.

The present invention involves an improvement in the structure and method for making a high voltage thin film transistor of the silicon-on-insulator (SOI) type. In particular, the present invention sets forth the structure and technique for making this improved structure in which a gate electrode is formed extending over the linear doping profile so as to shield the drift region from external electric fields and decrease on-state resistance.

BACKGROUND OF THE INVENTION

A major problem in high voltage integrated circuit technology is to find a satisfactory solution for the problem of isolation of components and sub-circuit sections. A solution to this problem was found in Ser. No. 07/650,391, filed Feb. 1, 1991 in which a lateral linear doping profile was formed in the silicon layer of a SOI device. Moreover, the silicon layer was provided as a thin layer of silicon having a thickness of about 2000 to 3000 angstroms. This structure formed a SOI semiconductor device having a high breakdown voltage characteristic.

This basic structure may suffer from problems occurring from external electric fields, caused by moisture or other contaminants on the surface of the wafer, acting on the drift region. Moreover, the prior structure has a higher device on resistance than necessary.

SUMMARY OF THE INVENTION

The present invention seeks to improve this previous structure by the provision of an extension of the gate electrode over the drift region.

The gate electrode is formed at one side of the drift region which is covered by an upper oxide layer. Accordingly, the gate electrode extends from the gate region laterally over the top of this oxide layer to cover all of the underlying drift region of the silicon layer.

Moreover, it has been found that this structure is significantly improved when the top oxide layer is made with the same thickness as the buried oxide layer below the silicon on insulator layer. The source and drain regions of the formed transistor are formed at opposite sides of the SOI layer.

An added benefit to this structure is the ability to deplete the drift region from both the top and bottom so that twice the conducting charge may be placed in the drift region. This lowers the on-resistance of the device.

The method of manufacturing this improved structure comprises forming a silicon layer on a buried oxide layer with the buried oxide layer being formed on a semiconductor substrate, forming a lateral linear doping region in the silicon layer, selectively thinning the drift region by local oxidation (LOCOS), leaving a thick top oxide layer over the drift region, and forming a gate region at a side of the top oxide layer with the gate region having a gate electrode with a portion extending laterally over a substantial portion of the top oxide layer where the lateral extent of the gate electrode overlies the thin lateral linear doping region. This technique of the present invention achieves the high voltage SOI semiconductor device having the improvements of the present invention.

BRIEF DESCRIPTION OF THE DRAWING FIGURES

Figure 2:
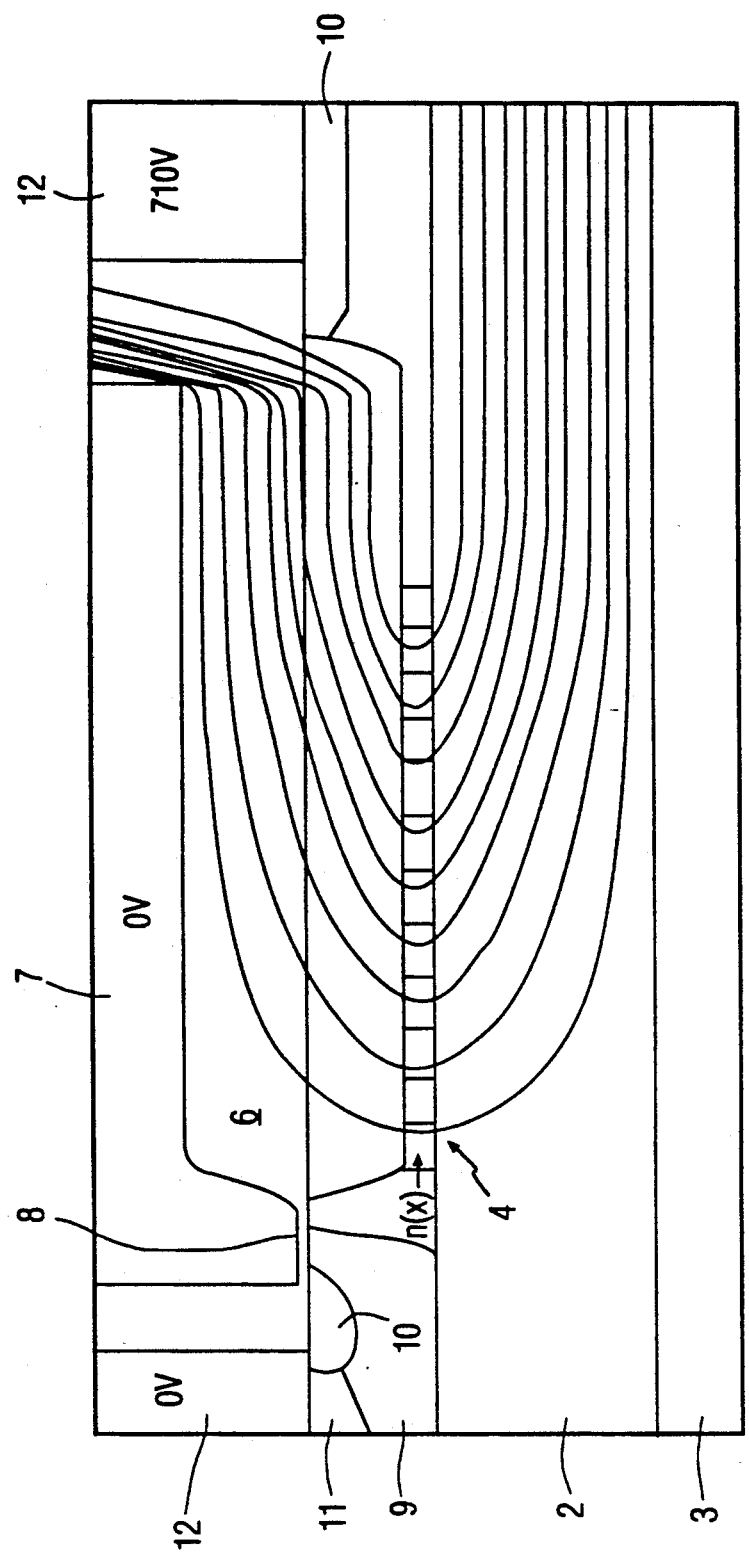

The invention is clearly described in detail by way of example With reference to the drawing figures. Therein:

FIG. 1 illustrate in cross-section the improved thin film transistor according to the present invention; and FIG. 2 illustrates a simulated computer plot of potential contours in a device having a lateral gate extension according to the present invention.

DESCRIPTION OF THE INVENTION

The improved SOI transistor of the present invention is illustrated in FIG. 1. Therein, a substrate 3 which may be either n-type or p-type conductivity is provided of any resistivity. A buried oxide layer 2 is deposited onto this substrate layer The thickness of the buried oxide layer 2 ranges from about 1 to 1.5 microns. Onto the buried oxide layer 2 is formed a silicon layer 1 having a linear lateral doping region 4. The formation of this linear lateral doping region is set forth in U.S. application Ser. No. 07/650,391, filed Feb. 1, 1991.

The area of the SOI device is surrounded by isolation regions 5 of insulating material. The silicon layer 1 is selectively thinned to a thickness ranging from 1000 to 2000 angstroms by standard LOCOS techniques. This involves using a mask of silicon nitride around the region 4 and growing a 1 to 1.5 micron thick layer of thermal silicon dioxide 6. This leaves the thinned layer 4 with the lateral linear doping profile providing the drift region of the SOI.

A polysilicon gate electrode and field plate 7 is formed by first growing a thin gate oxide 8 having a thickness of approximately 600 angstroms at the side of the oxide 6. Thereafter, 5000 angstroms of polysilicon are deposited thereon to form the gate electrode and field plate region. In accordance with the present invention, a mask is provided before forming the gate electrode to expose the upper surface of the silicon dioxide layer 6 so that the gate electrode 7 extends onto the surface of the upper oxide layer 6 as the field plate region.

This field plate extends from the gate electrode over the drift region portion of the thinned silicon layer 4.

The source and drain regions 10 are then formed of N+ conductivity, for example, at the sides of the gate and drift region. A p+source region 11 is also formed so that the source contact 12 contacts both regions. A drain contact 12 is formed in contact with the drain region 10, while a gate contact 12 is formed in contact with the gate region 7 overlying the thin oxide layer 8.

The top oxide layer 6 is formed with a thickness equal to the buried oxide layer 2. Also, the field plate of the gate electrode 7 extends laterally over the drift region 4.

A well protected drift region 4 is provided since any impinging external field, caused by moisture or other charged containments on the surface of the wafer, will terminate on the field plate of the gate electrode overlying the drift region. Further, the drift region may now be depleted from both the top and bottom so that twice the conducting charge may be placed on the drift region to lower the on-resistance. In addition, since the SOI film is thick (0.75-1.25 microns) in the source and drain regions, the p-body 9 is not left floating as in the structure of the parent application.

FIG. 2 shows a simulated computer plot of the electrostatic potential contours in a typical device having the field plate and gate 7 of the present invention. Such a SOI device has a high breakdown voltage of approximately 710 volts. The optimized drift region has a lateral doping profile n(x) with a peak doping near the drain region which is twice that of an identical structure without the gate electrode and field plate 7. The minimum drift region doping of the drift region 4, i.e. toward the gate structure, is also increased by a factor of 2.

What is claimed:

1. Method of making a semiconductor device comprising the steps of
   (a) forming a silicon layer on a buried oxide layer, said buried oxide layer being formed on a semiconductor substrate,
   (b) forming a lateral linear doping region in said silicon layer,
   (c) simultaneously thinning said lateral linear doping region to a reduced thickness, and growing a top oxide layer over the thinned lateral linear doping region, and
   (d) forming a gate region at a side of said top oxide layer, said gate region being a gate electrode and a field plate extending laterally from said gate electrode over a substantial portion of said top oxide layer, the lateral extent of said field plate overlying said thinned lateral linear doping region.

2. A method according to claim 1, wherein said lateral linear doping region is thinned to a thickness ranging from about 1000 to about 2000 angstroms.

3. A method according to claim 1, wherein said buried oxide layer and said top oxide layer are each formed with a thickness of about 1 to 1.5 microns.

4. A method according to claim 1, wherein said silicon layer in step (a) is formed to thickness of about 0.75 to 1.25 microns.

5. A method according to claim 1, wherein said step (d) is carried out by forming said gate electrode and said field plate to the same thickness.

* * * * *